(12) United States Patent
Yoon et al.

(10) Patent No.: US 12,009,484 B2
(45) Date of Patent: Jun. 11, 2024

(54) BATTERY CELL COMPRISING SEPARATOR HAVING MAGNETIC BODY FORMED THEREIN AND METHOD FOR EVALUATING BATTERY CELL SAFETY AGAINST INTERNAL SHORT CIRCUIT BY USING SAME

(71) Applicant: LG ENERGY SOLUTION, LTD., Seoul (KR)

(72) Inventors: Seo Young Yoon, Daejeon (KR); Tae Jong Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 231 days.

(21) Appl. No.: 17/631,367

(22) PCT Filed: Aug. 27, 2020

(86) PCT No.: PCT/KR2020/011447
§ 371 (c)(1),
(2) Date: Jan. 28, 2022

(87) PCT Pub. No.: WO2021/054636
PCT Pub. Date: Mar. 25, 2021

(65) Prior Publication Data
US 2022/0328889 A1 Oct. 13, 2022

(30) Foreign Application Priority Data
Sep. 20, 2019 (KR) .................. 10-2019-0116176

(51) Int. Cl.
*H01M 10/42* (2006.01)
*H01M 10/052* (2010.01)
(Continued)

(52) U.S. Cl.
CPC ..... *H01M 10/4235* (2013.01); *H01M 10/052* (2013.01); *H01M 10/48* (2013.01);
(Continued)

(58) Field of Classification Search
CPC ............. H01M 50/409; H01M 50/446; H01M 50/463; H01M 10/4235; H01M 10/48;
(Continued)

(56) References Cited

U.S. PATENT DOCUMENTS 5,051,157 A * 9/1991 O'Brien .................. B23H 3/00
429/10
5,523,730 A 6/1996 Van Zeeland
(Continued)

FOREIGN PATENT DOCUMENTS

CN 1142117 A 2/1997
CN 102738502 A 10/2012
(Continued)

OTHER PUBLICATIONS

Office Action issued in corresponding Japanese Patent Application No. 2022-503882 dated Feb. 20, 2023.
(Continued)

*Primary Examiner* — Jeremiah R Smith
(74) *Attorney, Agent, or Firm* — Morgan, Lewis & Bockius LLP (57) ABSTRACT

The present invention relates to a battery cell comprising a separator in which a perforated line and magnetic bodies adjacent to the perforated line are formed, and a method for evaluating battery cell safety by using same, wherein the battery cell can induce an internal short circuit without physical deformation of the cell structure, and can be effectively applied to evaluation of battery cell safety against an internal short circuit.

10 Claims, 6 Drawing Sheets

(51) Int. Cl.
*H01M 10/48* (2006.01)
*H01M 50/409* (2021.01)
*H01M 50/446* (2021.01)
*H01M 50/451* (2021.01)
*H01M 50/46* (2021.01)
*H01M 50/463* (2021.01)

(52) U.S. Cl.
CPC ....... *H01M 50/409* (2021.01); *H01M 50/446* (2021.01); *H01M 50/451* (2021.01); *H01M 50/46* (2021.01); *H01M 50/463* (2021.01)

(58) Field of Classification Search
CPC .. H01M 50/451; H01M 50/46; H01M 10/052; H01M 10/0525
See application file for complete search history.

(56) References Cited

U.S. PATENT DOCUMENTS

| | | | |
|---|---|---|---|
| 2008/0143337 | A1 | 6/2008 | Fujikawa et al. |
| 2008/0186030 | A1 | 8/2008 | Kasamatsu et al. |
| 2008/0187826 | A1 | 8/2008 | Kasamatsu et al. |
| 2008/0241674 | A1 | 10/2008 | Kim |
| 2009/0286148 | A1 | 11/2009 | Fujikawa et al. |
| 2010/0209767 | A1 | 8/2010 | Kasamatsu et al. |
| 2010/0316905 | A1 | 12/2010 | Maeng |
| 2011/0143252 | A1 | 6/2011 | Unoki et al. |
| 2012/0288736 | A1 | 11/2012 | Kim et al. |
| 2015/0072197 | A1 | 3/2015 | Sawanishi et al. |
| 2015/0147604 | A1* | 5/2015 | Baba ................ H01M 10/48 429/61 |
| 2018/0019476 | A1 | 1/2018 | Qiao et al. |
| 2018/0151884 | A1* | 5/2018 | Yushin ................ H01M 4/134 |
| 2021/0366666 | A1* | 11/2021 | Kirihara ................ H01M 50/10 |

FOREIGN PATENT DOCUMENTS

| | | |
|---|---|---|
| CN | 101790811 B | 9/2013 |
| CN | 208333899 U | 1/2019 |
| JP | H09-167637 A | 6/1997 |
| JP | H11-297367 A | 10/1999 |
| JP | 2002-373672 A | 12/2002 |
| JP | 2003-242963 A | 8/2003 |
| JP | 2007-253313 A | 10/2007 |
| JP | 2008-218390 A | 9/2008 |
| JP | 2009-164072 A | 7/2009 |
| JP | 2010-250954 A | 11/2010 |
| JP | 2015-087372 A | 5/2015 |
| JP | 2015-141846 A | 8/2015 |
| JP | 2017-003325 A | 1/2017 |
| JP | 2017-182976 A | 10/2017 |
| JP | 2018-137141 A | 8/2018 |
| KR | 10-2004-0107999 A | 12/2004 |
| KR | 10-2008-0073652 A | 8/2008 |
| KR | 10-2008-0073661 A | 8/2008 |
| KR | 10-2009-0071664 A | 7/2009 |
| KR | 10-0908977 B1 | 7/2009 |
| KR | 10-2009-0130412 A | 12/2009 |
| KR | 10-0988694 B1 | 10/2010 |
| KR | 10-2011-0070905 A | 6/2011 |
| KR | 10-2012-0126630 A | 11/2012 |
| KR | 10-2014-0140092 A | 12/2014 |
| KR | 10-2017-0087747 A | 7/2017 |

OTHER PUBLICATIONS

Office Action dated Aug. 31, 2023 issued in corresponding Chinese Patent Application No. 202080055203.4.
International Search Report (with partial translation) and Written Opinion dated Dec. 3, 2020 issued in corresponding International Patent Application No. PCT/KR2020/011447.
International Search Report issued in corresponding International Patent Application No. PCT/KR2020/011447 issued dated Dec. 3, 2020.
Written Opinion issued in corresponding International Patent Application No. PCT/KR2020/011447 issued dated Dec. 3, 2020.
Extended European Search Report issued in corresponding European Patent Application No. 20865693.4 dated Sep. 5, 2022.

* cited by examiner

BATTERY CELL COMPRISING SEPARATOR HAVING MAGNETIC BODY FORMED THEREIN AND METHOD FOR EVALUATING BATTERY CELL SAFETY AGAINST INTERNAL SHORT CIRCUIT BY USING SAME

TECHNICAL FIELD

This application claims the benefit of priority based on Korean Patent Application No. 10-2019-0116176, filed on Sep. 20, 2019, and the entire contents of the Korean patent application are incorporated herein by reference.

The present invention relates to a battery cell including a separator formed with a magnetic body and a method for evaluating the safety of the battery cell according to an internal short circuit using the same.

BACKGROUND ART

In recent years, as the price of energy sources increases due to the depletion of fossil fuels and the interest of environmental pollution is amplified, the demand for environmentally friendly alternative energy sources has become an indispensable factor for future life. In particular, as technology development and demand for mobile devices increase, the demand for secondary batteries as energy sources is rapidly increasing.

In general, a secondary battery assembles an electrode assembly by using a positive electrode, a negative electrode, and interposing a separator between the positive electrode and the negative electrode. The assembled electrode assembly is mounted on a battery case and an electrolyte is injected to manufacture a battery cell.

Among secondary batteries, lithium secondary batteries are used in various fields due to their excellent electrical properties. However, the lithium secondary battery has a problem of low safety. For example, a lithium secondary battery may ignite or explode in abnormal operating conditions such as overcharging, overdischarging, exposure to high temperatures, or electrical short circuits. Specifically, heat and gas are generated as active materials or electrolytes, which are components of the battery cell, cause a decomposition reaction. The generated heat and gas increase the temperature and pressure inside the battery cell. The elevated temperature and pressure further accelerate the decomposition reaction and eventually cause ignition or explosion.

Therefore, it is very important to ensure the safety of the battery cell, and one of the methods is to evaluate the safety of the battery cell when an internal short circuit occurs. However, there have been a method of putting a heating element inside the battery cell to induce an internal short circuit and induce internal heat, a method of pre-drilling a separator and treating the area with chemicals to thereby be dissolved at a certain temperature, or a method of inducing an internal short circuit by tearing the separator by inserting a certain type of metallic material and applying external force, etc. However, these methods have limitations in that the separator is deformed or is different from the actual use environment of the battery cell.

DISCLOSURE

Technical Problem

The present invention is invented to solve the above problems, and an object of the present invention is to provide a battery cell capable of testing the safety of an internal short circuit without physically changing the structure of the battery cell, and a battery cell safety evaluation method according to an internal short circuit using the same.

Technical Solution

In order to achieve the above purpose, the battery cell according to the present invention a structure in which an electrode assembly including a positive electrode, a negative electrode, and a separator interposed between the positive electrode and the negative electrode is housed in a battery case, and the separator includes: a perforated line formed in all or part of the separator; and a magnetic body which is formed in a region adjacent to the perforated line and does not overlap, and is arranged continuously or discontinuously at a position spaced apart from each other along the perforated line.

In one example, the perforated line forms a two-dimensional closed shape on the surface of the separator. In another example, the perforated line has a structure in which a plurality of through-type slits or bead-type non-penetrating grooves are arranged discontinuously.

In one example, the magnetic body is in the form of a powder, and is in a state of being fully or partially impregnated in the separator. Further, in another example, the magnetic body has a bar shape, and is attached to one side or both sides of the separator.

In a specific example, the magnetic body has a structure including a core having magnetic properties and an insulating polymer shell surrounding the core. For example, the core is an alloy made of one or more selected from the group consisting of iron (Fe), nickel (Ni), cobalt (Co), gadolinium (Gd), terbium (Tb), and dysprosium (Dy). In addition, the insulating polymer shell has a structure formed of a polymer film.

In one example, the battery cell according to the present invention is a lithium secondary battery.

In addition, the present invention provides a method for evaluating the safety of a battery cell according to an internal short circuit using the battery cell described above. In one example, the evaluation method includes inducing a short circuit inside the battery cell. In a specific example, the battery cell according to the present invention has a structure in which an electrode assembly including a positive electrode, a negative electrode, and a separator interposed between the positive electrode and the negative electrode is housed in a battery case. the separator includes: a perforated line formed in all or part of the separator; and a magnetic body which is formed in a region adjacent to the perforated line and does not overlap, and is arranged continuously or discontinuously at a position spaced apart from each other along the perforated line. Further, in the step of inducing a short circuit inside the battery cell, the magnet is rotated while the magnet is adjacent to or in contact with the outer peripheral surface of the battery cell, and the perforated line of the separator is partially or completely broken in response to the rotational motion of the magnet.

In one example, the perforated line forms a two-dimensional closed shape on the surface of the separator.

In a specific example, the step of inducing a short circuit inside the battery cell is performed during a charge/discharge cycle for the battery cell.

Advantageous Effects

The battery cell according to the present invention can induce an internal short circuit without physically changing the structure of the battery cell, and can be effectively applied to a method for evaluating the safety of a battery cell according to the internal short circuit.

DETAILED DESCRIPTION OF THE PREFERRED EMBODIMENTS

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof.

Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

Hereinafter, the present invention will be described in detail.

The present invention relates to a battery cell in which a perforated line and a magnetic body are formed in a separator. Specifically, the battery cell according to the present invention has a structure in which an electrode assembly including a positive electrode, a negative electrode, and a separator interposed between the positive electrode and the negative electrode is housed in a battery case. In addition, the separator may include a perforated line formed in all or part of the separator; and a magnetic body formed in a region adjacent to the perforated line but not overlapping, and arranged continuously or discontinuously at a position spaced apart from each other along the perforated line.

The battery cell according to the present invention can be effectively applied to an internal short circuit test. The magnetic body is in a state of being bonded to the separator, and when the magnet is moved from the outside, the magnetic body is also moved in response to the movement of the magnet. Stress is also applied to the separator according to the direction of movement of the magnetic body. For example, when the magnet is moved or rotated while the magnet is in contact with or adjacent to the outside of the battery cell, the magnetic body formed in the separator is moved in response to the movement of the magnet. When the magnetic body is moved, the perforated line adjacent to the magnetic body is broken, thereby inducing an internal short circuit of the battery cell.

In addition, the magnetic body according to the present invention is formed in a region adjacent to the perforated line but not overlapping, but is continuously or discontinuously arranged at a position spaced apart at a predetermined interval along the perforated line. For example, when a perforated line including a linear section is formed in the separator, a first point of the perforated line and a second point spaced apart from the first point at a predetermined interval are set. Magnetic bodies are formed in regions adjacent to the first and second points of the perforated line, respectively. In this case, the magnetic body may be a linearly connected shape or a structure formed separately near the first and second points. In the present invention, when the magnet rotates outside the battery cell, the magnetic body located near the first point and the magnetic body located near the second point of the perforated line move in different directions. Through this, when the magnetic body formed by being spaced apart from the two points moves in different directions, stress is applied to the perforated line formed in the separator in different directions. The stress applied in different directions partially breaks the perforated line and induces an internal short circuit of the battery cell.

In one example, the perforated line forms a two-dimensional closed shape on the surface of the separator. The present invention more clearly induces an internal short circuit of the battery cell due to the rotation of the external magnet by forming a closed-shaped perforated line. In a specific example, in the two-dimensional closed shape formed by the perforated line, the length in one direction may be different from the length in the direction perpendicular to the one direction. This is to facilitate the breakage of the perforated line when the magnet is rotated outside the battery cell. For example, the two-dimensional closed shape formed by the perforated line is an oval, a rectangle, or a triangular shape having a different side length.

In another example, the perforated line has a structure in which a plurality of through-type slits or bead-type non-penetrating grooves are arranged discontinuously. Specifically, the perforated line has a structure in which a plurality of through-type slits or bead-type non-penetrating grooves are spaced apart from each other at regular intervals. Arranging the perforated line discontinuously prevents the perforated line portions of the separator from being broken even by a small impact.

In the present invention, the magnetic body has a structure that is bonded to the separator in various forms. For example, the magnetic body is in the form of a powder, and is in a state of being fully or partially impregnated in the separator. For another example, the magnetic body has a bar shape, and is attached to one side or both sides of the separator. When the magnetic body is in the form of powder, the magnetic body may be applied near the perforated line while being mixed with a binder on one surface of the separator. In addition, when the magnetic body has a bar shape, the magnetic body may be bonded to a separator with a binder interposed therebetween.

In one example, the magnetic body has a structure including a core having magnetic properties and an insulating polymer shell surrounding the core. For example, the core is an alloy made of one or more selected from the group consisting of iron (Fe), nickel (Ni), cobalt (Co), gadolinium (Gd), terbium (Tb), and dysprosium (Dy). In addition, the insulating polymer shell has a structure formed of a polymer film. By forming the insulating polymer shell on the magnetic core, there is an effect of imparting electrical insulation without deteriorating the magnetism of the magnetic body.

In addition, the present invention provides a method for evaluating the safety of a battery cell according to an internal short circuit using the battery cell described above.

In one example, the evaluation method includes inducing a short circuit inside the battery cell. The battery cell has a structure in which an electrode assembly including a positive electrode, a negative electrode, and a separator interposed between the positive electrode and the negative electrode is housed in a battery case. The separator may include a perforated line formed in all or part of the separator; and a magnetic body formed in a region adjacent to the perforated line but not overlapping, and arranged continuously or discontinuously at a position spaced apart by a certain distance along the perforated line. Specifically, in the step of inducing a short circuit inside the battery cell, the magnet is rotated while the magnet is adjacent to or in contact with the outer peripheral surface of the battery cell, and the perforated line of the separator is partially or completely broken in response to the rotational motion of the magnet.

In one example, the perforated line forms a two-dimensional closed shape on the surface of the separator. The shape formed by the perforated line is as described above.

In a specific example, the step of inducing a short circuit inside the battery cell is performed during a charge/discharge cycle for the battery cell. For example, a charge/discharge cycle test may be performed on the battery cell, and an internal short circuit test of the battery cell may be performed assuming a case in which an internal short circuit occurs during the charge/discharge cycle.

In the present invention, the internal short circuit test is a test for evaluating the resistance to cell internal short circuit among the safety tests of the battery cell, and is a test simulated when a positive electrode and a negative electrode are shorted inside the battery cell. In the internal short circuit test, a cell internal short circuit is generated for a fully charged battery cell, and the behavior of the battery cell is evaluated. In general, when a short circuit occurs inside the cell, the voltage decreases as the battery cell is discharged, and when the voltage decreases to a certain value or less, the battery cell is evaluated for rupture, voltage or temperature change.

In one example, the battery cell according to the present invention includes: an electrode assembly including a positive electrode, a negative electrode, and a separator interposed between the positive electrode and the negative electrode; a non-aqueous electrolyte solution impregnating the electrode assembly; and a battery case accommodating the electrode assembly and the electrolyte solution.

The positive electrode has a structure in which a positive electrode active material layer is stacked on one or both sides of a positive electrode current collector. In one example, the positive electrode active material layer includes a positive electrode active material, a conductive material, and a binder polymer, and if necessary, may further include a positive electrode additive commonly used in the art.

The positive electrode active material may be a lithium-containing oxide, and may be the same or different. A lithium-containing transition metal oxide may be used as the lithium-containing oxide.

For example, the lithium-containing transition metal oxide may be any one or a mixture of two or more selected from the group consisting of $Li_xCoO_2$ (0.5<x<1.3), $Li_xNiO_2$ (0.5<x<1.3), $Li_xMnO_2$ (0.5<x<1.3), $Li_xMn_2O_4$ (0.5<x<1.3), $Li_x(Ni_aCo_bMn_c)O_2$ (0.5<x<1.3, 0<a<1, 0<b<1, 0<c<1, a+b+c=1), $Li_xNi_{1-y}Co_yO_2$ (0.5<x<1.3, 0<y<1), $Li_xCo_{1-y}Mn_yO_2$ (0.5<x<1.3, 0≤y<1), $Li_xNi_{1-y}Mn_yO_2$ (0.5<x<1.3, O<y<1), $Li_x(Ni_aCo_bMn_c)O_4$ (0.5<x<1.3, 0<a<2, 0<b<2, 0<c<2, a+b+c=2), $Li_xMn_{2-z}Ni_zO_4$ (0.5<x<1.3, 0<z<2), $LixMn_{2-z}Co_zO_4$ (0.5<x<1.3, 0<z<2), $Li_xCoPO_4$ (0.5<x<1.3) and $Li_xFePO_4$ (0.5<x<1.3), and the lithium-containing transition metal oxide may be coated with a metal or metal oxide such as aluminum (Al). Further, in addition to the lithium-containing transition metal oxide, sulfide, selenide, and halide may be used.

The positive electrode active material may be included in the range of 94.0 to 98.5 wt % in the positive electrode active material layer. When the content of the positive electrode active material satisfies the above range, it is advantageous in terms of manufacturing a high-capacity battery and providing sufficient conductivity of the positive electrode or adhesion between electrode materials.

The current collector used for the positive electrode is a metal having high conductivity, and any metal which the positive electrode active material slurry may be easily attached to and which is not reactive in the voltage range of the electrochemical device can be used. Specifically, non-limiting examples of the current collector for the positive electrode include aluminum, nickel, or a foil manufactured by a combination thereof.

The positive electrode active material layer further includes a conductive material. The conductive material is usually added in an amount of 1 to 30% by weight based on the total weight of the mixture including the positive electrode active material. Such a conductive material is not particularly limited as long as it has conductivity without causing a chemical change in the secondary battery. For example, graphite such as natural graphite or artificial graphite; carbon black such as carbon black, acetylene black, ketjen black, channel black, furnace black, lamp black, or thermal black; conductive fiber such as carbon fiber or metal fiber; metal powder such as carbon fluoride, aluminum, or nickel powder; conductive whiskey such as zinc oxide or potassium titanate; conductive metal oxide such as titanium oxide; and polyphenylene derivative may be used as the conductive material. As the binder polymer, a binder commonly used in the art may be used without limitation. For example, various kinds of binders such as polyvinylidene fluoride-co-hexafluoropropylene (PVDF-co-HFP), polyvinylidene fluoride (PVDF), polyacrylonitrile, polymethyl methacrylate, styrene-butadiene rubber (SBR), and carboxyl methyl cellulose (CMC) may be used.

The content of the binder polymer is proportional to the content of the conductive material included in the upper positive electrode active material layer and the lower positive electrode active material layer. This is to impart adhesion to conductive materials whose particle size is relatively small compared to the active material and is because when the content of the conductive material increases, more binder polymer is required, and when the content of the conductive material decreases, less binder polymer can be used.

The negative electrode has a structure in which a negative electrode active material layer is stacked on one or both sides of a negative electrode current collector. In one example, the negative electrode active material layer includes a negative electrode active material, a conductive material, and a binder polymer, and if necessary, may further include a negative electrode additive commonly used in the art.

The negative electrode active material may include a carbon material, lithium metal, silicon or tin. When a carbon material is used as the negative electrode active material, both low crystalline carbon and high crystalline carbon may be used. Representative examples of low crystalline carbon include soft carbon and hard carbon. Representative examples of high crystalline carbon include natural graphite, kish graphite, pyrolytic carbon, mesophase pitch based carbon fiber, mesocarbon microbeads, mesophase pitches, and high-temperature calcined carbons such as petroleum or coal tar pitch derived cokes.

Non-limiting examples of the current collector used for the negative electrode include copper, gold, nickel, or a foil manufactured by a copper alloy or a combination thereof. In addition, the current collector may be used by stacking substrates made of the above materials.

In addition, the negative electrode may include a conductive material and a binder commonly used in the art.

The separator may be made of any porous substrate used in a lithium secondary battery, and for example, a polyolefin-based porous membrane or a nonwoven fabric may be used, but the present invention is not particularly limited thereto.

Examples of the polyolefin-based porous membrane include polyethylene such as high density polyethylene, linear low density polyethylene, low density polyethylene, ultra high molecular weight polyethylene, and a membrane in which polyolefin-based polymers, such as polypropylene, polybutylene, and polypentene, are each formed alone or in a mixture thereof.

Polyethyleneterephthalate, polybutyleneterephthalate, polyester, polyacetal, polyamide, polycarbonate, polyimide, polyetheretherketone, polyethersulfone, polyphenyleneoxide, polyphenylenesulfide, polyethylenenaphthalene, etc. may be used individually or as a polymer by a mixture thereof, to thereby form the non-woven fabric, in addition to polyolefin-based nonwoven fabric. The structure of the nonwoven fabric may be a spunbond nonwoven fabric composed of long fibers or a melt blown nonwoven fabric.

The thickness of the porous substrate is not particularly limited, but may be 5 to 50 μm, and the pore size and porosity present in the porous substrate are also not particularly limited, but may be 0.01 to 50 μm and 10 to 95%, respectively.

Meanwhile, in order to improve mechanical strength of the separator composed of the porous substrate and to suppress a short circuit between the positive electrode and the negative electrode, a porous coating layer including inorganic particles and a binder polymer may be further included on at least one surface of the porous substrate.

The electrolyte may contain an organic solvent and an electrolyte salt, and the electrolyte salt is a lithium salt. Those conventionally used in the electrolyte for lithium secondary batteries may be used as the lithium salt without limitation. For example, one or more selected from the group consisting of $F^-$, $Cl^-$, $Br^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $CF_3(CF_2)_7SO_3^-$, $CF_3CO_2^-$, $CH_3CO_2^-$, $SCN^-$ and $(CF_3CF_2SO_2)_2N^-$ may be included as the anion of the lithium salt.

As the organic solvent included in the electrolyte described above, those conventionally used in electrolytes for lithium secondary batteries may be used without limitation, and for example, ethers, esters, amides, linear carbonates, and cyclic carbonates may be used alone or in combination of two or more. Among them, representatively, a cyclic carbonate, a linear carbonate, or a carbonate compound that is a mixture thereof may be included.

Specific examples of the cyclic carbonate compound include any one selected from the group consisting of ethylene carbonate (EC), propylene carbonate (PC), 1,2-butylene carbonate, 2,3-butylene carbonate, 1,2-pentylene carbonate, 2,3-pentylene carbonate, vinylene carbonate, vinylethylene carbonate, and a halide thereof, and a mixture thereof. These halides include, for example, fluoroethylene carbonate (FEC), but are not limited thereto.

In addition, specific examples of the linear carbonate compound include any one selected from the group consisting of dimethyl carbonate (DMC), diethyl carbonate (DEC), dipropyl carbonate, ethylmethyl carbonate (EMC), methylpropyl carbonate, and ethylpropyl carbonate, or the mixture of two or more of them may be typically used, but is not limited thereto.

In particular, among the carbonate-based organic solvents, ethylene carbonate and propylene carbonate, which are cyclic carbonates, are organic solvents of high viscosity and have high dielectric constants, so that lithium salts in the electrolyte can be more easily dissociated, and if the cyclic carbonate is mixed with a low viscosity, low dielectric constant linear carbonate such as dimethyl carbonate and diethyl carbonate in an appropriate ratio, an electrolyte solution having a higher electrical conductivity can be prepared.

In addition, as the ether of the organic solvent, any one selected from the group consisting of dimethyl ether, diethyl ether, dipropyl ether, methylethyl ether, methylpropyl ether, and ethylpropyl ether, or a mixture of two or more thereof may be used, but is not limited thereto.

And esters among the organic solvents include any one selected from the group consisting of methyl acetate, ethyl acetate, propyl acetate, methyl propionate, ethyl propionate, propyl propionate, γ-butyrolactone, γ-valerolactone, and γ-caprolactone, or a mixture of two or more of them, but the present invention is not limited thereto.

The injection of the non-aqueous electrolyte may be performed at an appropriate step in the manufacturing process of the electrochemical device, depending on the manufacturing process and required physical properties of the final product. That is, it can be applied before assembling the electrochemical device or at the final stage of assembling the electrochemical device.

The battery cell according to the present invention refers to an electrochemical device that undergoes an electrochemical reaction. For example, the battery cell is a lithium secondary battery including a lithium metal secondary battery, a lithium ion secondary battery, a lithium polymer secondary battery, or a lithium ion polymer secondary battery, etc.

As the inventive concept allows for various changes and numerous embodiments, particular embodiments will be illustrated in the drawings and described in detail in the text.

However, this is not intended to limit the present invention to the specific form disclosed, and it should be understood to include all changes, equivalents, and substitutes included in the spirit and scope of the present invention.

Hereinafter, the present invention will be described in more detail through drawings and the like.

Figure 1:
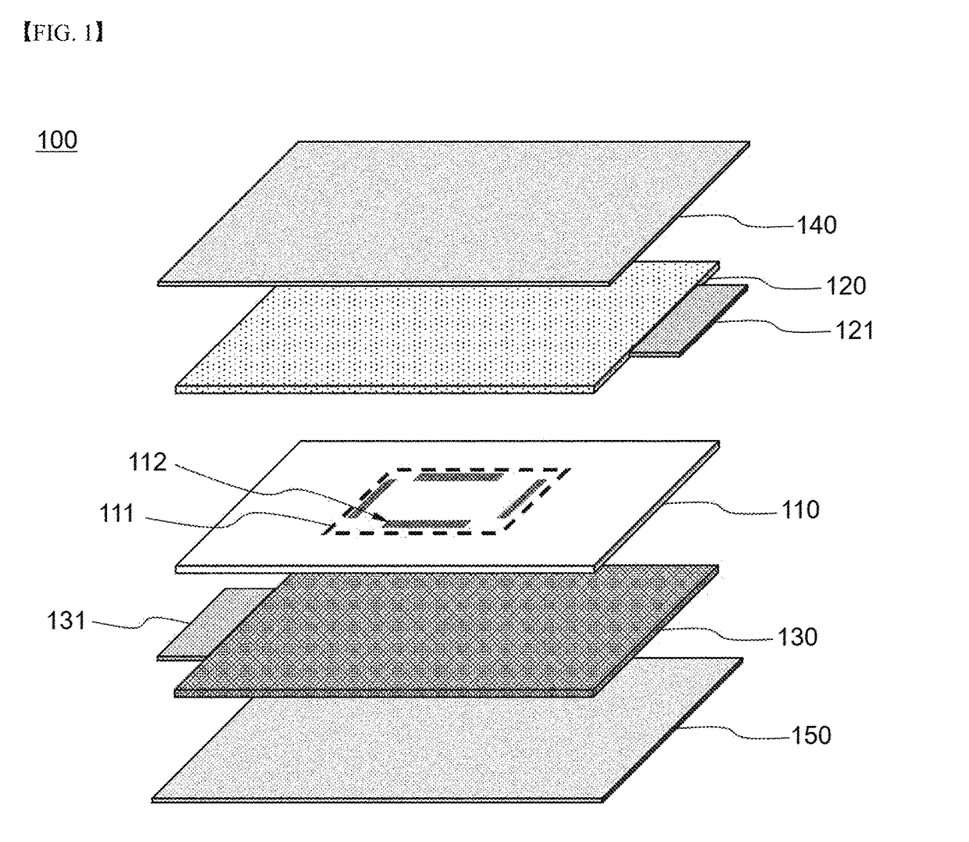
FIG. 1 is an exploded view schematically showing the structure of a battery cell according to an embodiment of the present invention.

FIG. 1 is an exploded view schematically showing the structure of a battery cell according to an embodiment of the present invention. Referring to FIG. 1, the battery cell 100 according to the present invention includes: an electrode assembly including a positive electrode 120, a negative electrode 130, and a separator 110 interposed between the positive electrode 120 and the negative electrode 130; a non-aqueous electrolyte solution (not shown) to impregnate the electrode assembly; and battery cases 140 and 150 accommodating the electrode assembly and the electrolyte solution. A positive electrode tab 121 is formed to protrude and extend in one direction of the positive electrode 120, and a negative electrode tab 131 is formed to protrude and extend in one direction opposite to the protruding and extending direction of the positive electrode tab 121.

The separator 110 has a rectangular perforated line 111 formed thereon, and the perforated line 111 has a structure in which a plurality of linear slits or linear grooves are arranged at regular intervals. A magnetic body 112 is arranged in a position adjacent to the perforated line 111. The magnetic body 112 has a bar shape and is located inside each side of a rectangular structure formed by a perforated line.

Figure 2:
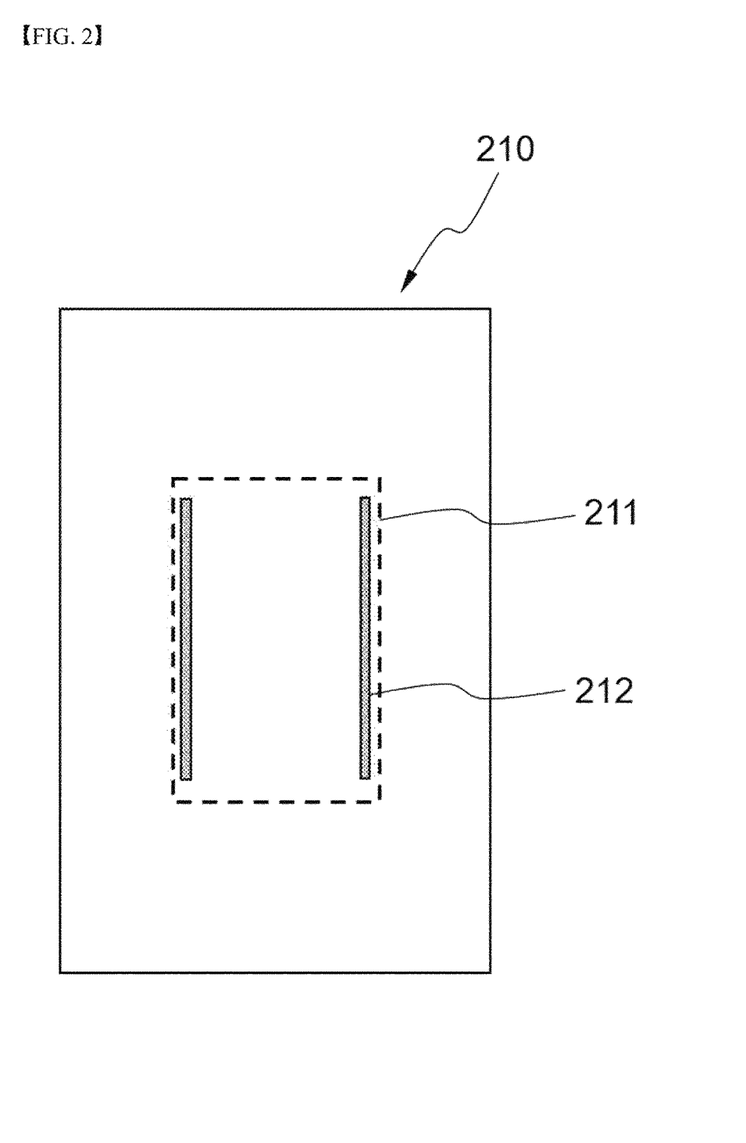
FIGS. 2 to 5 are front views each schematically showing a separator provided with a perforated line and a magnetic body according to an embodiment of the present invention.

FIGS. 2 to 5 are front views each schematically showing a separator provided with a perforated line and a magnetic body according to an embodiment of the present invention. Referring to FIG. 2, the separator 210 according to an embodiment of the present invention has a rectangular perforated line 211 formed thereon, and the perforated line 211 has a structure in which a plurality of linear slits are arranged at regular intervals. The magnetic body 212 is arranged so as to be adjacent to the perforated line 211. The magnetic body 212 has a bar shape and is positioned in parallel while forming an 11 shape inside a rectangular structure formed by the perforated line.

Figure 3:
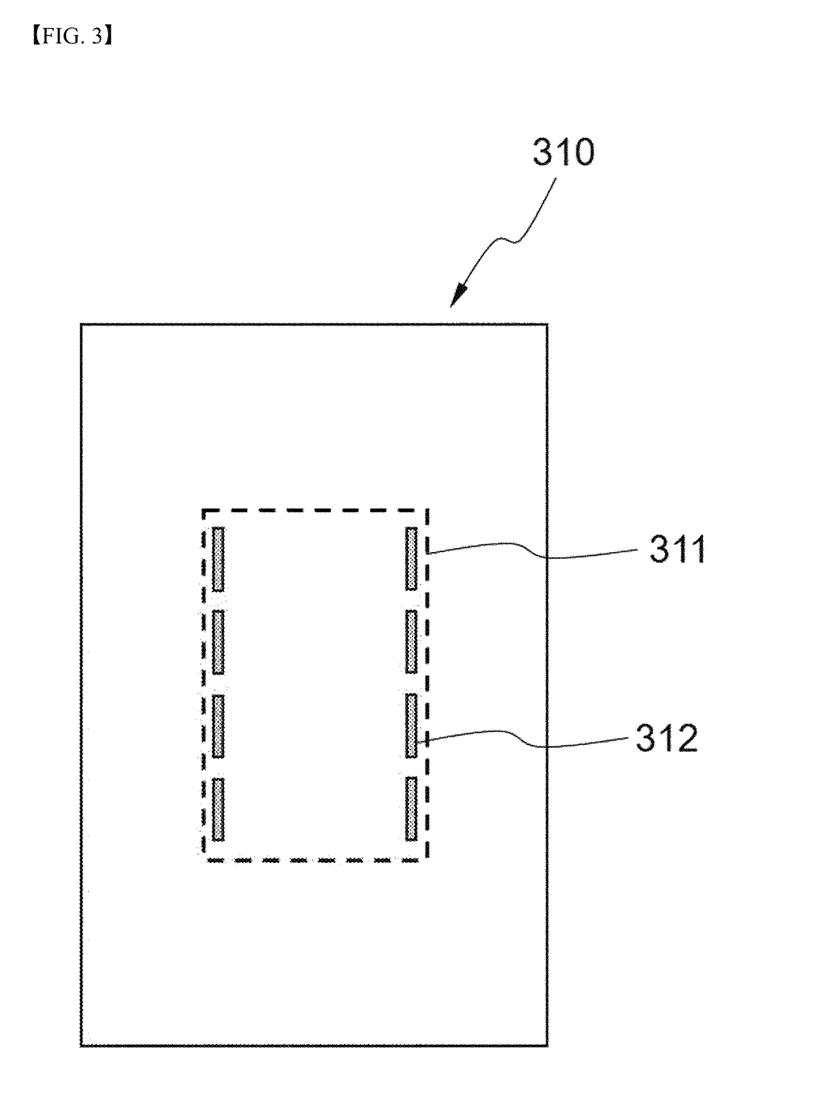

Referring to FIG. 3, the separator 310 according to an embodiment of the present invention has a rectangular perforated line 311 formed thereon, and the perforated line 311 has a structure in which a plurality of linear grooves are arranged at regular intervals. The magnetic body 312 is arranged so as to be adjacent to the perforated line 311. The magnetic body 312 has a shape in which short bars are arranged at regular intervals, and is positioned in parallel while forming an 11 shape inside a rectangular structure formed by a perforated line.

Figure 4:
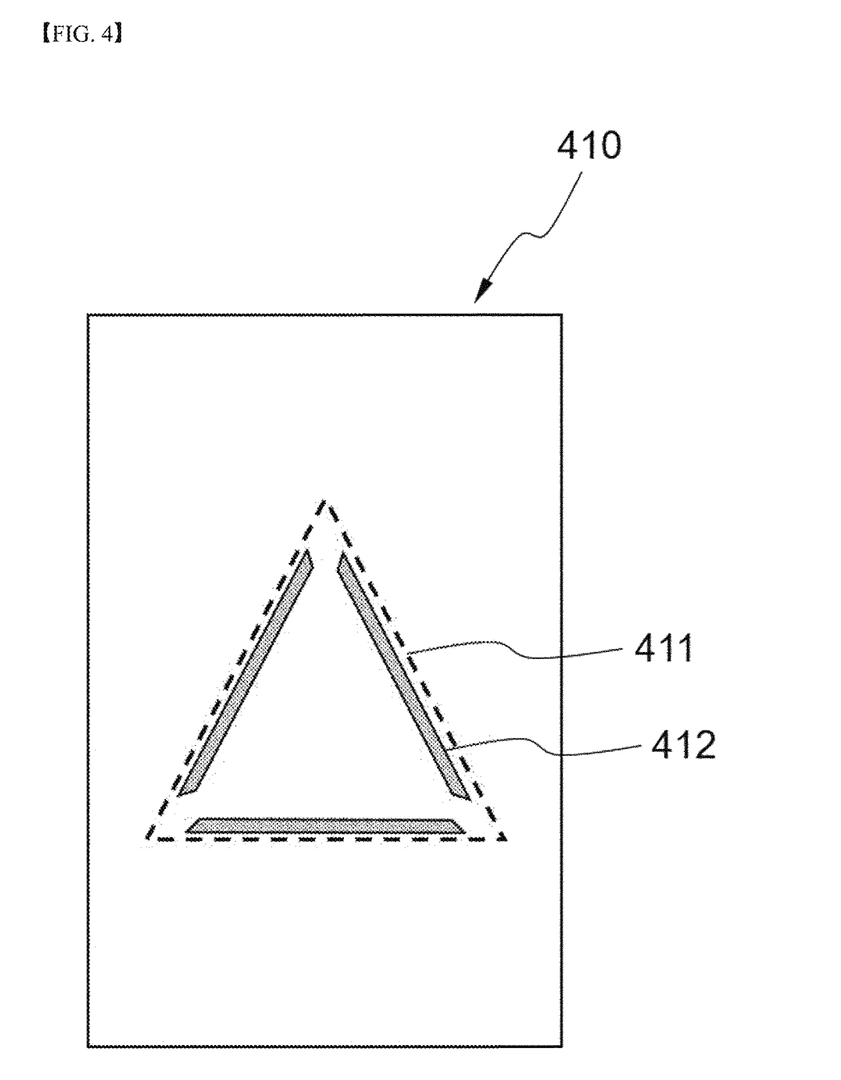

Referring to FIG. 4, the separator 410 according to an embodiment of the present invention has a triangular perforated line 411 formed thereon, and the perforated line 411 has a structure in which a plurality of linear grooves are arranged at regular intervals. The magnetic body 412 is arranged so as to be adjacent to the perforated line 411. The magnetic body 412 has a bar shape and is located inside the triangular structure formed by the perforated line and adjacent to the perforated line.

Figure 5:
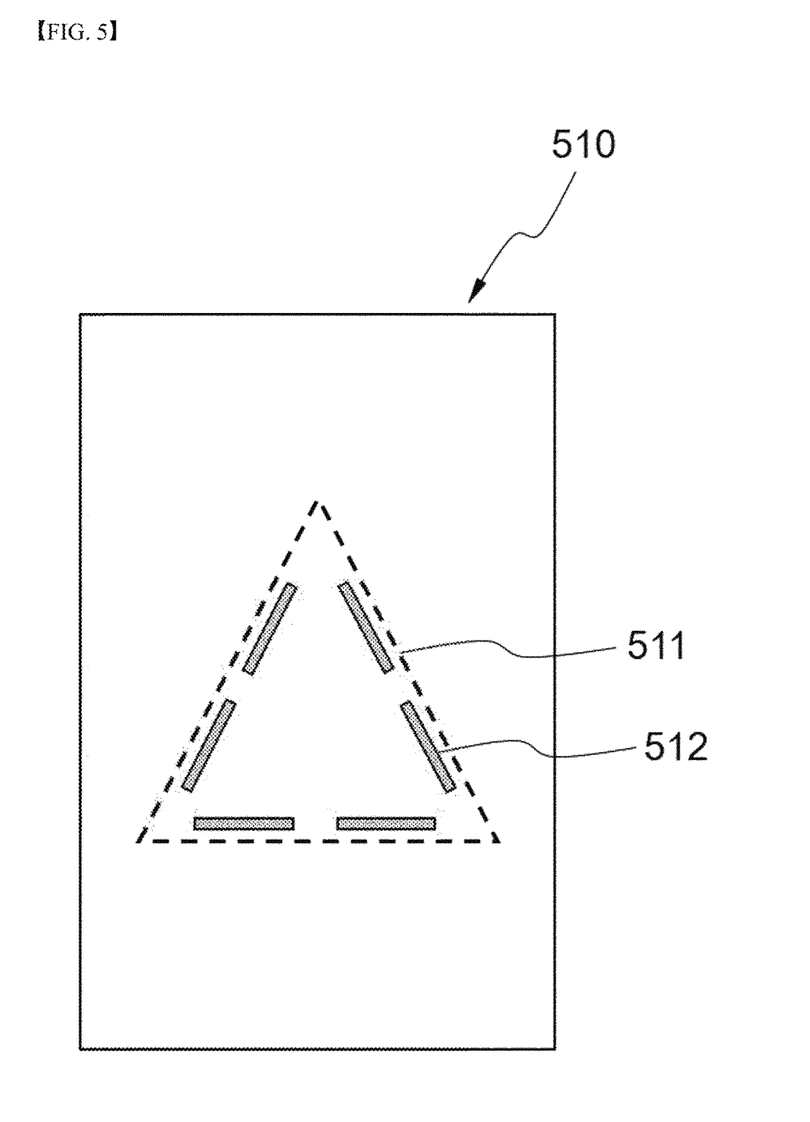

Referring to FIG. 5, the separator 510 according to an embodiment of the present invention has a triangular perforated line 511 formed thereon, and the perforated line 511 has a structure in which a plurality of linear slits are arranged at regular intervals. The magnetic body 512 is arranged so as to be adjacent to the perforated line 511. The magnetic body 512 has a shape in which short bars are arranged at regular intervals, and is located inside the triangular structure formed by the perforated line and adjacent to the perforated line.

Figure 6:
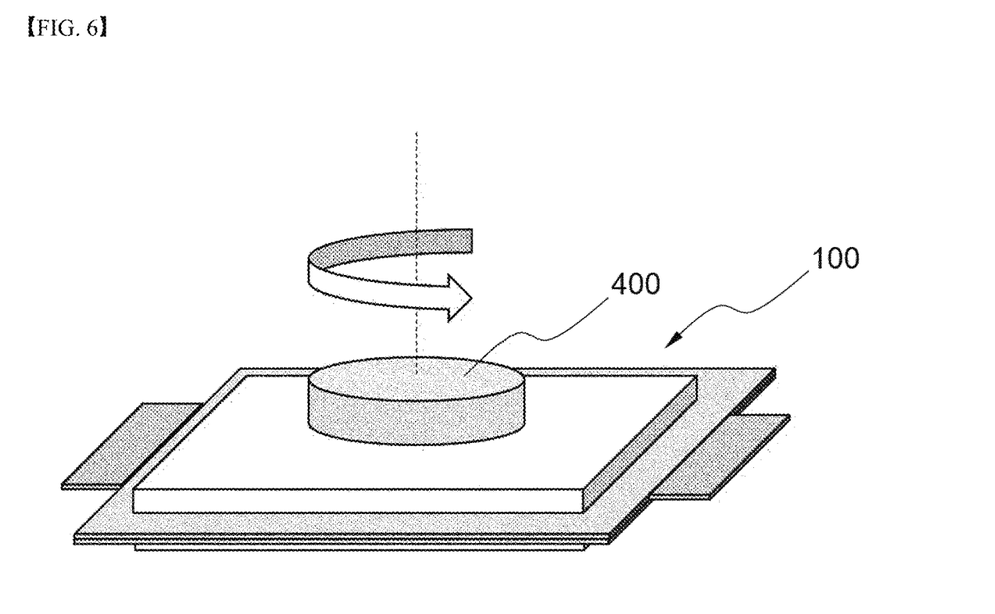
FIG. 6 is a schematic diagram showing a process of inducing an internal short circuit in a battery cell according to an embodiment of the present invention by using a magnet.

FIG. 6 is a schematic diagram showing a process of inducing an internal short circuit in a battery cell according to an embodiment of the present invention by using a magnet. Referring to FIG. 6, safety evaluation according to an internal short circuit is possible using the battery cell 100 according to an embodiment of the present invention. When the magnet 400 is moved from the outside of the battery cell 100, the magnetic body attached adjacent to the perforated line of the separator also moves in response to the movement of the magnet 400. Specifically, when the magnet 400 is rotated in place while the magnet 400 is in contact with or adjacent to the outside of the battery cell 100, the magnetic body coupled to the separator moves in response to the movement of the magnet 400. When the magnetic body is moved, the perforated line adjacent to the magnetic body is broken, thereby inducing an internal short circuit of the battery cell 100.

The invention claimed is:

1. A secondary battery having a structure in which an electrode assembly including a positive electrode, a negative electrode, and a separator interposed between the positive electrode and the negative electrode is housed in a battery case,
wherein the separator includes:
a perforated line which forms a two-dimensional closed shape on a surface of the separator; and
a magnetic body formed in an area adjacent to, but spaced apart from, the perforated line, so as not to overlap the perforated line, wherein the magnetic body comprises a plurality of distinct magnetic body portions which are arranged continuously or discontinuously along the perforated line.

2. The battery cell of claim 1, wherein the perforated line has a structure in which a plurality of through-type slits or bead-type non-penetrating grooves are arranged discontinuously.

3. The battery cell of claim 1, wherein the magnetic body is in a form of a powder and is fully or partially impregnated in the separator.

4. The battery cell of claim 1, wherein the magnetic body is in a form of a bar, and is attached to one side or both sides of the separator.

5. The battery cell of claim 1, wherein the magnetic body has a structure including a core having magnetic properties and an insulating polymer shell surrounding the core.

6. The battery cell of claim 5, wherein the core is an alloy including one or more selected from the group consisting of iron (Fe), nickel (Ni), cobalt (Co), gadolinium (Gd), terbium (Tb), and dysprosium (Dy).

7. The battery cell of claim 5, wherein the insulating polymer shell comprises a polymer film.

8. The battery cell of claim 1, wherein the battery cell is a lithium secondary battery.

9. A method of evaluating a safety of a battery cell according to an internal short circuit, comprising:
inducing a short circuit inside the battery cell,
wherein the battery cell has a structure in which an electrode assembly including a positive electrode, a negative electrode, and a separator interposed between the positive electrode and the negative electrode is housed in a battery case,
wherein the separator includes: a perforated line which forms a two-dimensional closed shape on a surface of the separator; and a magnetic body which is formed in a region adjacent to, but spaced apart from, the perforated line, so as not to overlap the perforated line, wherein the magnetic body comprises a plurality of distinct magnetic body portions which are arranged continuously or discontinuously along the perforated line, and
wherein, in the inducing the short circuit inside the battery cell, the magnet is rotated while the magnet is adjacent to or in contact with an outer peripheral surface of the battery cell, and the perforated line of the separator is partially or completely broken in response to the rotational motion of the magnet.

10. The method of claim 9, wherein the inducing the short circuit inside the battery cell is performed during a charge/discharge cycle for the battery cell.

* * * * *